United States Patent [19]
Fu

[11] Patent Number: 5,636,177
[45] Date of Patent: Jun. 3, 1997

[54] STATIC RANDOM ACCESS MEMORY WITH IMPROVED NOISE IMMUNITY

[75] Inventor: Chien-Chih Fu, Hsinchu, Taiwan

[73] Assignee: United Microelectronics Corp., Taiwan

[21] Appl. No.: 587,153

[22] Filed: Jan. 16, 1996

[51] Int. Cl.⁶ .................................................. G11C 7/00
[52] U.S. Cl. ........................................ 365/233.5; 365/206
[58] Field of Search ............................... 365/233.5, 233, 365/206, 207, 208

[56] References Cited

U.S. PATENT DOCUMENTS

| | | | |
|---|---|---|---|
| 4,962,487 | 10/1990 | Suzuki | 365/233.5 |
| 5,306,963 | 4/1994 | Leak | 365/233.5 |
| 5,479,374 | 12/1995 | Kobayashi | 365/233.5 |

Primary Examiner—A. Zarabian
Attorney, Agent, or Firm—Ladas & Parry

[57] ABSTRACT

A semiconductor static random access memory (SRAM) device having a noise eliminating means is disclosed. The SRAM device includes a memory cell array, a row detector, a column detector, an address buffer, an access control pulse generator, a sense amplifier and an address transition detector. The address buffer receives an externally issued memory access address for relay to the row decoder for the decode of the row address. The received access address is also relayed to the address transition detector in order to detect the transition status of the address bits of the access address received so as to cause the access control pulse generator to generate a sense amplifier enable signal and a word line enable signal. The noise eliminator means receives the sense amplifier enable signal and the word line enable signal and conducts a logical OR conversion of the signals which is issued to the sense amplifier, in order to enable the sense amplifier to implement the data access to the SRAM device without allowing the noise interference to cause erroneous data over the device data bus.

8 Claims, 5 Drawing Sheets

STATIC RANDOM ACCESS MEMORY WITH IMPROVED NOISE IMMUNITY

BACKGROUND OF THE INVENTION

1. Field of the Invention

This application originates from Taiwan patent application No. 84112800 filed Nov. 30, 1995. Said document is incorporated herein by reference.

The present invention relates in general to semiconductor static random access memories (SRAM's). In particular, the present invention relates to an SRAM device having noise elimination circuitry for improving noise immunity during memory access operations.

2. Technical Background

Typical conventional SRAM devices have an electrical circuit schematically shown in the block diagram of FIG. 1. An SRAM device comprises primarily a memory cell array 11 that includes cells arranged in rows and columns. In addition to the memory cell array 11, the typical SRAM device may further include a row address decoder 12, a column address decoder 13, an address buffer 14, an access control pulse generator 15, a sense amplifier 16, an address transition detector (ATD) 17, an output buffer 18, and an I/O port 19.

Notice that FIG. 1 only schematically shows the structural block diagram of the typical SRAM device in its read mode, therefore, only an output buffer 18 is shown therein. During such memory read cycles, while data stored in the memory cell array 11 may be read out, data can also be written into the memory cell array 11 in write cycles in the reverse direction of read data flow, as persons skilled in this art may be well aware.

The memory cell array 11 is itself comprised typically of hundreds of thousands of memory cells 110 orderly arranged in an array of rows and columns. Whenever memory access to the SRAM device is desired, that is, data are either read out from or written into the array 11, an external memory controller not shown in the drawing issues an access address XA via the peripheral address bus 10. The access address is then buffered in the address buffer 14 and decoded by both the row address decoder 12 and column address decoder 13 to obtain the row and column addresses respectively. Based on this pair of row and column addresses, the desired data may be either retrieved or stored in the correct location inside the memory cell array 11.

The relative timing sequence of the various components in the SRAM device of FIG. 1 is shown in the timing diagram of FIG. 2. With simultaneous reference to FIGS. 1 and 2, when a typical read access cycle performed against the SRAM device of FIG. 1 is initiated, the access address XA is sent by the memory controller via the peripheral address bus 10 to the address buffer 14 for temporary storage during the cycle. Whenever any bit of the access address XA is detected by the address transition detector 17 to have undergone a logical state transition 21, the address transition detector 17 will then issue a relatively short pulse 22 to the access control pulse generator 15. Upon detecting the trailing edge of the short pulse 22 generated by the address transition detector 17, the access control pulse generator 15 may then generate and send a word line enable signal WLE 23 and a sense amplifier enable signal SAE 24 to the row address decoder 12 and the sense amplifier 16 respectively.

Word line enable signal WLE 23 may be employed by the row decoder 12 to turn on the corresponding word line WL in the memory cell array 11 for a predetermined short time period 25. On the other hand, the sense amplifier enable signal SAE 24 allows the sense amplifier 16 to be enabled almost at the same time when the selected word line WL is turned on for the period 25. When the selected word line remains turned on, the data stored in the very memory cell corresponding to the access address XA appears on a corresponding pair of bit lines BL and BLB as a voltage difference 26. This voltage difference 26 which represents the stored data that is to be read in the discussed SRAM read cycle may then be sensed by an amplifier and read out by the circuitry of the column decoder 13. Sense amplifier 16 subsequently amplifies this data signal to convert it into the data 27 having an appropriate voltage level which is then sent to the output buffer 18 and latched. The data in the output buffer 18 is then relayed to the I/O port 19 for supply to the logics exterior of the SRAM device that requested for the data.

When the sense amplifier enable pulse SAE is terminated as is seen in FIG. 2, the sense amplifier 16 will be disabled, and its output turned off accordingly. However, since the read data has already been latched in the output buffer 18, the accessed data in the very SRAM read cycle may thus be maintained for a time period sufficient to meet the requirements of the data requesting logics in the system.

In these conventional SRAM devices, when the word line enable pulse WLE is terminated, all the word lines in the memory cell array 11 will be turned off as well. No unnecessary power dissipation will take place in any memory cell unit in the array as a result of any word line being left turned on. The overall power consumption of the SRAM device can therefore be minimized as much as possible.

In those general environments for the application of these conventional SRAM devices, however, there are the possibilities that unexpected noise signals arise to interfere with the read cycle operations. Such noise signals may cause erroneous actions of the constituent components of the SRAM device that result in the presence of erroneous data in the I/O port of the memory device. FIG. 3 of the drawing, for example, shows the conventional SRAM device of FIG. 1 conducting a read access cycle that is interfered with by the occurrence of a noise pulse.

The noise interference situation as exemplified in FIG. 3 is caused by a noise pulse 31. The pulse 31 occurs amongst the bits of the access address XA and causes address transition detector 17 to generate a short pulse 32 having a time period much shorter than its normal pulse. This short pulse 32 triggered as a result of the presence of the noise in the memory access address bits causes the access control pulse generator 15 to issue a short WLE pulse 33 and SAE pulse 34 to row decoder 12 and sense amplifier 16 respectively. Although such noise-triggered SAE pulses 34 would generally have a very short time period, it is, however, still possible for this period to be sufficiently long enough to enable the functioning of the sense amplifier 16. Once the sense amplifier 16 is enabled without the word line WL properly turned on as signified by the low pulse 35, random erroneous data 37 may still occur. This noise-triggered erroneous data 37 would be undesirably latched by the output buffer 18 and subsequently conveyed via the I/O port 19 to the exterior logics.

SUMMARY OF THE INVENTION

It is therefore the primary object of the present invention to provide an SRAM device with a noise elimination circuit for improving noise immunity during memory access operations.

To achieve the above-identified object, the present invention provides an SRAM device with a noise eliminating means. The SRAM device includes a memory cell array, a row detector, a column detector, an address buffer, an access control pulse generator, a sense amplifier and an address transition detector. The address buffer receives an externally issued memory access address for relay to the row decoder to decode the row address. The received access address is also relayed to the address transition detector in order to detect the transition status of the address bits of the access address received so as to cause the access control pulse generator to generate a sense amplifier enable signal and a word line enable signal. The noise eliminator means receives the sense amplifier enable signal and the word line enable signal and conducts a logical OR conversion of said signals which is issued to the sense amplifier, for enabling the sense amplifier to implement the data access to the SRAM device without allowing the noise interference to trigger erroneous data over the device data bus.

In accordance with the disclosure of the present invention, the noise eliminating means comprises basically a dual-input logical NOR gate. One input of the NOR gate is connected to a time delay circuit to receive the input of the word line enable signal, and the other input is connected to receive the input of the sense amplifier enable signal. The output of the NOR gate is connected via an inverter in order to enable the sense amplifier.

BRIEF DESCRIPTION OF THE DRAWINGS

The present invention is described in detail with reference to the accompanying drawings in which.

DETAILED DESCRIPTION OF THE PREFERRED EMBODIMENTS

Figure 1:
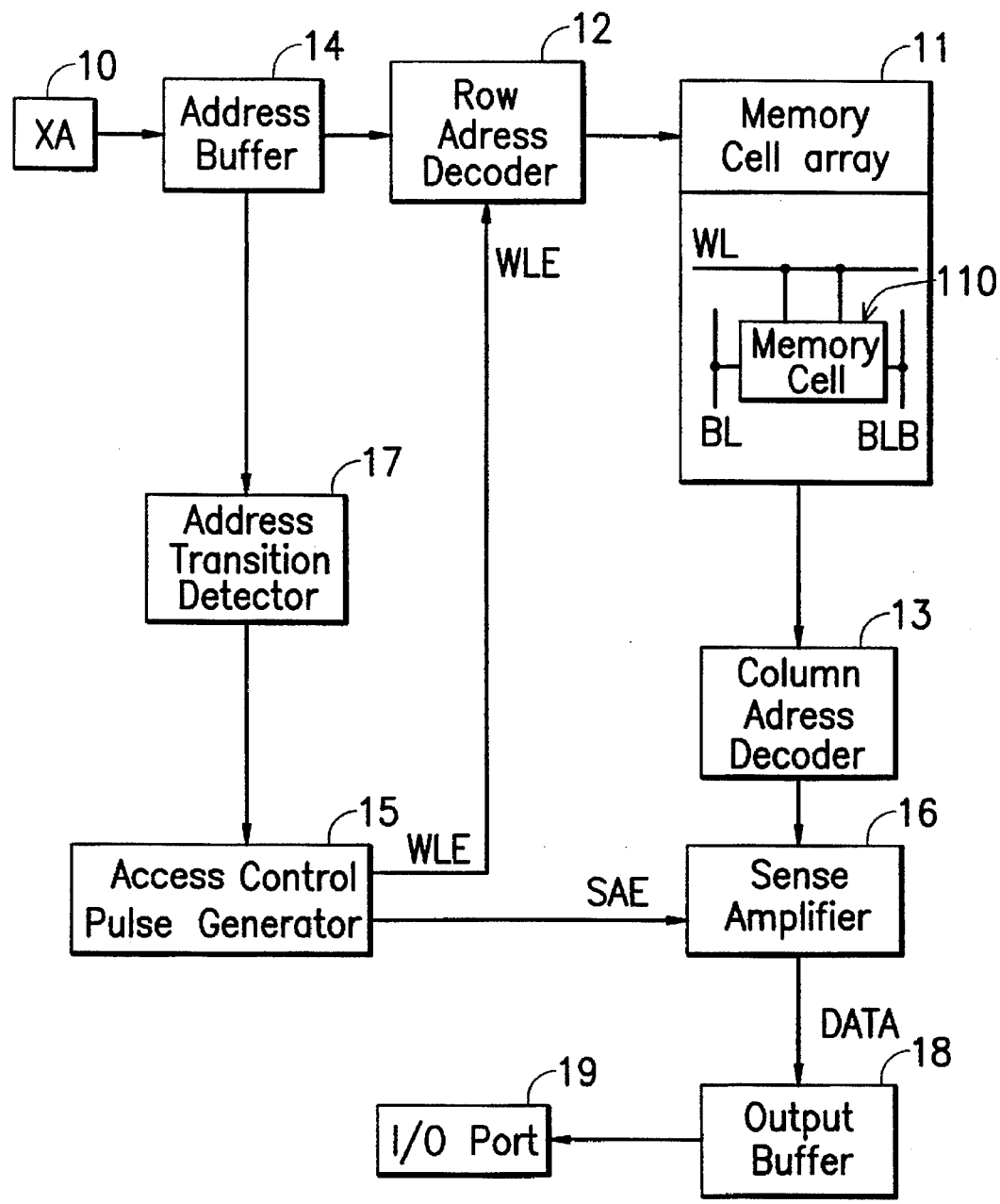
FIG. 1 schematically shows the block diagram of a conventional SRAM device.
Figure 2:
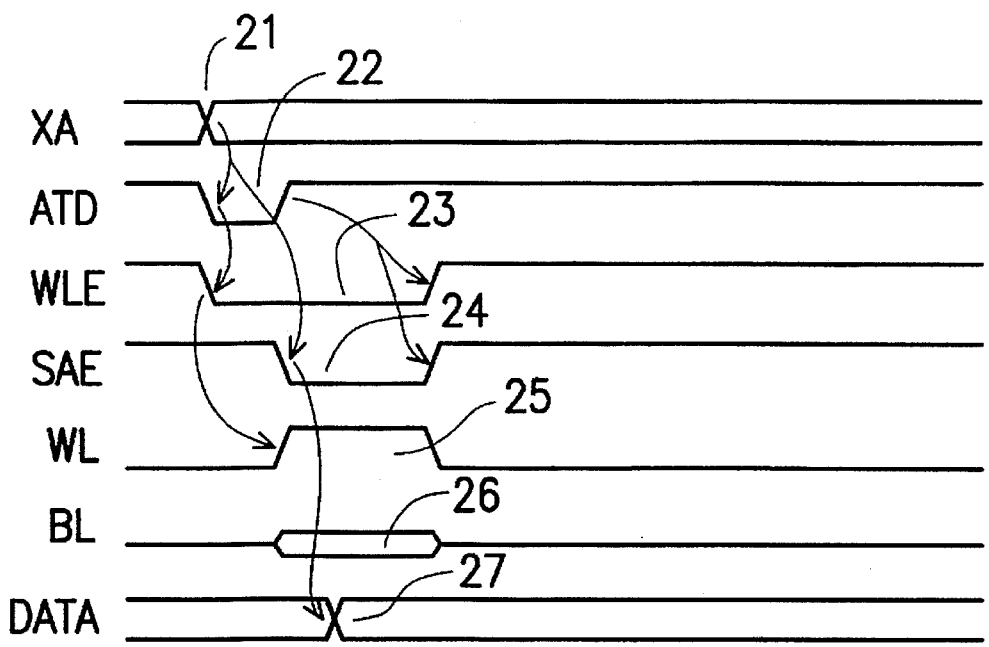
FIG. 2 schematically shows the time sequence diagram of the conventional SRAM device of FIG. 1 that is undergoing a memory access operation.
Figure 3:
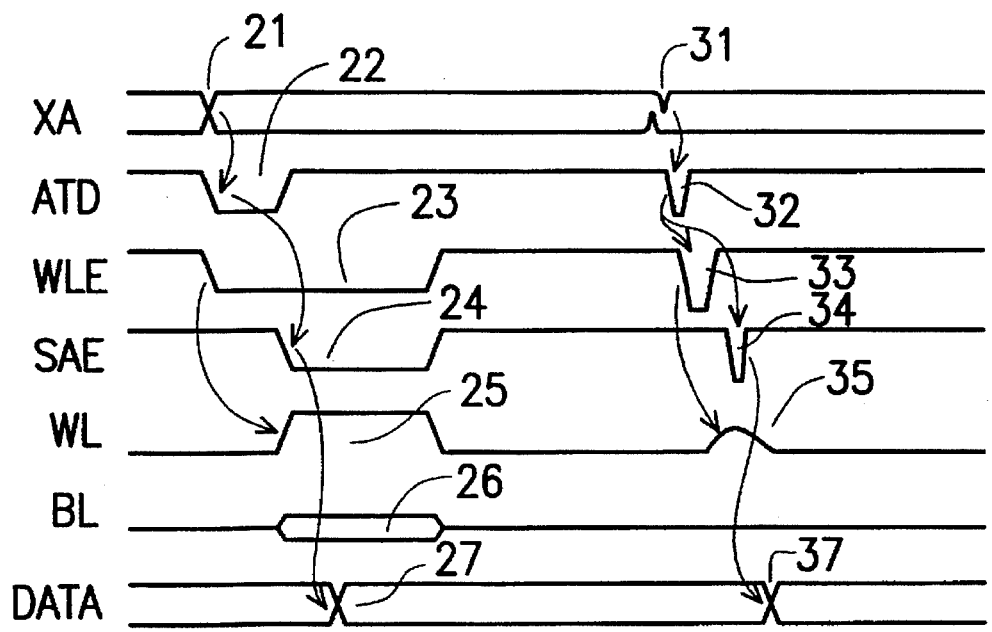
FIG. 3 schematically shows the time sequence diagram of the conventional SRAM device of FIG. 1 that is undergoing a memory access operation while experiencing a noise pulse interference.
Figure 4:
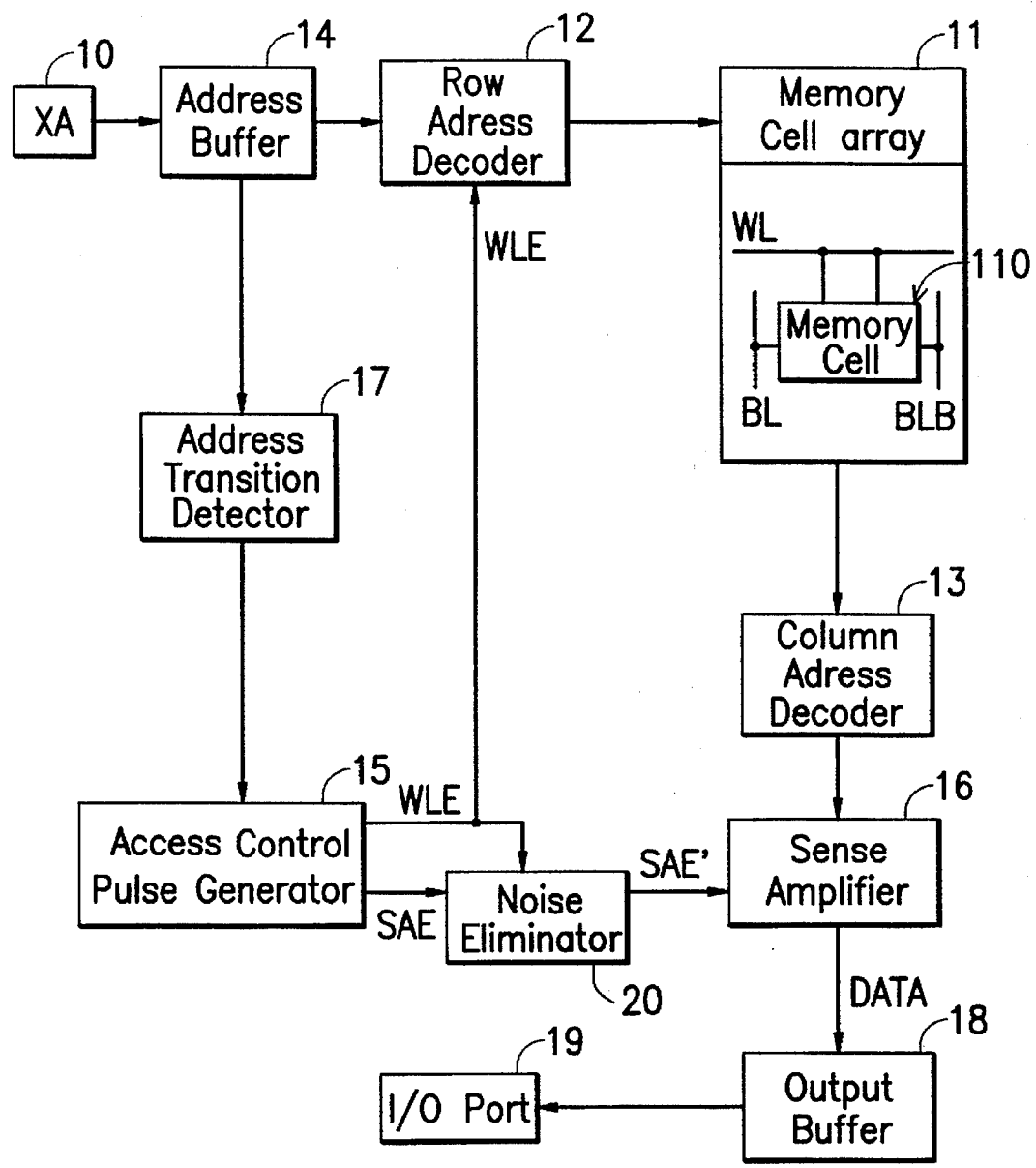
FIG. 4 schematically shows the block diagram of the SRAM device employing a noise eliminator means in accordance with a preferred embodiment of the present invention.

Refer to FIG. 4 of the accompanying drawing of the present invention. FIG. 4 schematically shows the block diagram of the SRAM device employing a noise eliminator means in accordance with a preferred embodiment of the present invention. As is seen in the drawing, the noise eliminator 20 is inserted between the access control pulse generator 15 and the sense amplifier 16, which are the constituent components of the SRAM device. The noise eliminator 20 receives the sense amplifier enable signal SAE and the word line enable signal WLE as inputs and generates a modified version of the sense amplifier enable signal SAE'. The modified SAE' signal is free of noise interference, thus preventing the erroneous triggering of the sense amplifier 16.

Figure 5:
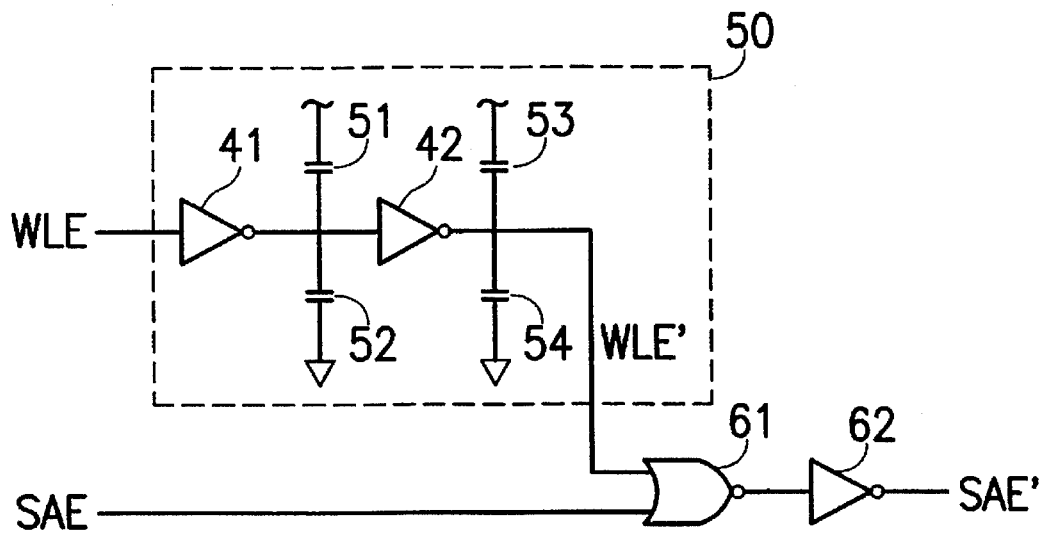
FIG. 5 shows the schematic diagram of a preferred embodiment of the noise eliminating circuit that may be employed in the SRAM device of FIG. 4.
Figure 6:
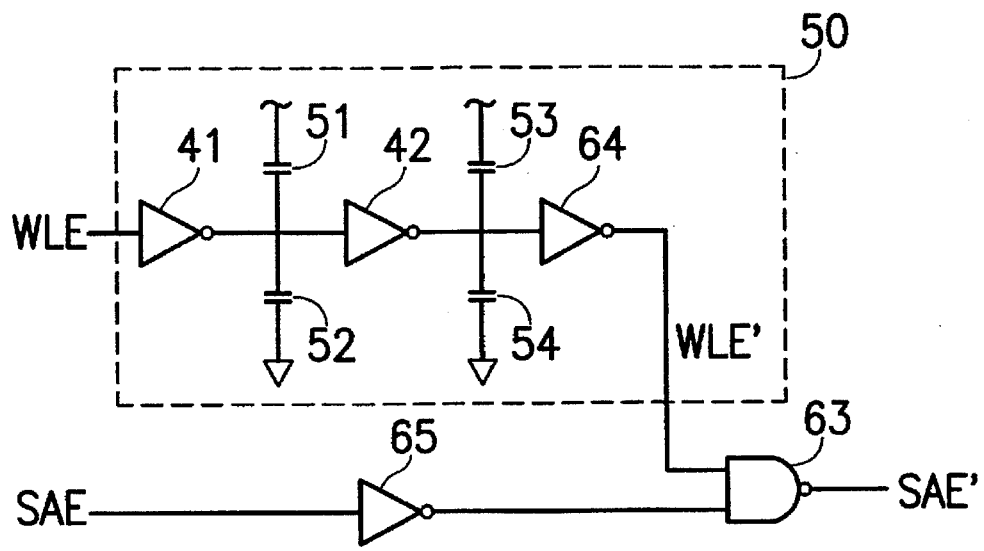
FIG. 6 shows the schematic diagrams of another preferred embodiment of the noise eliminating circuit that may be employed in the SRAM device of FIG. 4.

FIGS. 5 and 6 show the schematic diagrams of two of the preferred embodiments of the noise eliminator 20 that may be employed in the typical SRAM device of FIG. 4. These two circuitry embodiments of the noise eliminator means show how the hardware may be implemented in accordance with the present invention.

Refer first to the noise eliminator means of FIG. 5. Noise eliminator 20 comprises a dual-input logical NOR gate 61 having one of its inputs connected to receive the sense amplifier enable signal SAE issued by the access control pulse generator 15. The other input thereof is fed by the processed version of the word line enable signal WLE also issued by the access control pulse generator 15. As is seen in the drawing, the word line enable signal WLE is inverted twice by a couple of cascaded inverters 41 and 42 before being sent to the second input of the NOR gate 61. Each of the output ends of the respective inverters 41 and 42 are tied to the power and ground bus respectively of the system via the capacitors 51, 52, 53 and 54. The combination of the two inverters 41 and 42 and the four capacitors 51, 52, 53 and 54 constitutes a WLE delay circuit 50 to delay the word line enable signal WLE before sending it to the NOR gate 61. The output of the NOR gate 61 is tied to the input of another inverter 62, which issues the modified version of the sense amplifier enable signal SAE'.

In other words, the original sense amplifier enable signal SAE as issued by the access control pulse generator 15 is conditioned by the modified WLE' signal that is delayed in the WLE delay circuit 50. The conditioned signal is then inverted and outputted as the modified version of the sense amplifier enable signal SAE'.

The WLE delay circuit 50, as is seen in FIG. 5, is basically a cascade of two consecutive inverters 41 and 42 that each has its output capacitively coupled respectively to the power bus and ground bus of the system via the pairs of capacitors 51 and 52 as well as 53 and 54. With such capacitive charging and discharging delays in the capacitor network as well as the propagation delays in the inverters, the logical status of the resulted WLE' signal is kept the same as the input WLE signal with only its timing delayed. Further, such delay circuit can also absorb and eliminate the noise glitches that may arise in the input word line enable signal WLE.

Therefore, as may be seen in FIG. 5, the noise eliminator 20 to be utilized in FIG. 4 can modify the original sense amplifier enable signal SAE issued by the access control pulse generator 15 with a delayed modified version of the word line enable signal WLE'. The modified version of the sense amplifier enable signal SAE' bears a logical function that is outlined in the truth table of Table 1 below.

TABLE 1

| SAE' | = | SAE | + | −(−(WLE)) |
|---|---|---|---|---|
| 0 |  | 0 |  | 0 |
| 1 |  | 0 |  | 1 |
| 1 |  | 1 |  | 0 |
| 1 |  | 1 |  | 1 |

Based on the listing of the truth table of Table 1, it can be seen that when the sense amplifier enable signal SAE is issued as a logical 0 signal, the modified version of the sense amplifier enable signal SAE' will never turn out a logical 0 if the delayed word line enable signal WLE'-(-(WLE)) also has a logical state of 0. In other words, when the access control pulse generator 15 is not supposed to enable the sense amplifier 16, it can never be erroneously triggered into the enabled status as long as the word line enable signal is not true. This achieves the purpose of preventing the erroneous fanning out of data over the device data bus.

The noise eliminator means shown in FIG. 6 is a logical equivalent of that of FIG. 5 described above. As persons skilled in the art may well appreciate, the NAND gate 63 employed in FIG. 6 constitutes a de Morgan equivalent of the NOR gate 61 of FIG. 5 when it is coupled with the two inverters 64 and 65 each tied to one of its two input ends.

Figure 7:
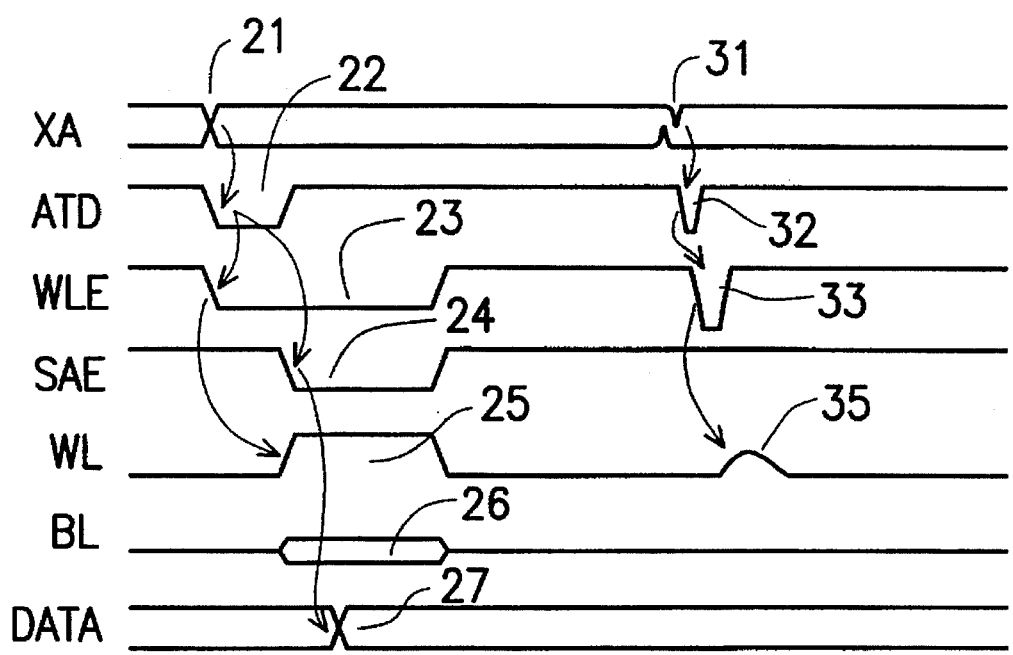
FIG. 7 schematically shows the time sequence diagram for read access from the SRAM device equipped with a noise eliminating circuit.

FIG. 7 schematically shows the time sequence diagram for the read access from the SRAM device having equipped with a noise eliminating circuitry. If when an SRAM device equipped with the noise eliminator 20 is accessed, the data access address as contained in the access address XA is subject to the interference by a noise pulse 31, the address transition detector 17 will be triggered to generate a short ATD pulse 32 as a result. Although the short ATD pulse 32 has a much shorter pulse length than that when it is normally generated, however, it can cause the access control pulse generator 15 to issue a short noise-bound WLE signal 33 toward the row decoder 12. In the case of an SRAM device equipped with the noise eliminator 20 such as the one depicted in FIG. 4, the noise-triggered WLE 33 will, however, not be able to trigger the sense amplifier 16.

Even if the word line enable signal path resulting from a short WLE noise signal 33 could still trigger a noise glitch in the word line WL of the device, due to the noise absorption capability of the noise eliminator 20 as described above, the sense amplifier enable signal SAE' that is actually sent over to the sense amplifier 16 would contain no noise at all, as is seen in the time sequence diagram of FIG. 6. As a result, although there has been the presence of noise glitch 31 in the access address XA, there will be no erroneous data issued over the data bus of the device. The noise, and as a result, the consequence of the noise is eliminated altogether.

Thus, with the utilization of the noise eliminating means of the present invention, semiconductor SRAM devices having improved noise immunity capability will be possible with the addition of relatively simple logic circuitry therein. The situation of erroneous data arising over the device data bus will be eliminated in an environment where noises are inevitable.

I claim:

1. A semiconductor static random access memory device comprising a memory cell array, a row decoder, a column decoder, an address buffer, an access control pulse generator, a sense amplifier, an address transition detector, said address buffer receiving an externally issued memory access address for relay to said row decoder in order to decode the row address, and for relay to said address transition detector in order to detect the transition status of the address bits of said access address received so as to trigger said access control pulse generator to generate a sense amplifier enable signal and a word line enable signal, and a noise eliminating means for receiving said sense amplifier enable signal and said word line enable signal and for conducting a logical OR conversion of said signals which is issued to said sense amplifier for enabling said sense amplifier to implement the data access to said static random access memory device.

2. The semiconductor static random access memory device of claim 1, wherein said noise eliminating means comprises a dual-input logical NOR gate, one input of said NOR gate being connected to a time delay circuit to receive said word line enable signal, and the other input being connected to receive said sense amplifier enable signal, and an output of said NOR gate being connected via an inverter for enabling said sense amplifier.

3. The semiconductor static random access memory device of claim 2, wherein said time delay circuit for said word line enable signal comprises a cascade of two consecutive inverters.

4. The semiconductor static random access memory device of claim 2, wherein said time delay circuit for said word line enable signal comprises a cascade of two consecutive inverters each having an output thereof connected to a power and ground bus respectively via a pair of capacitors.

5. The semiconductor static random access memory device of claim 1, wherein said noise eliminating means comprises a dual-input logical NAND gate, one input of said NAND gate being connected via a first inverter to a time delay circuit to receive said word line enable signal, and the other input being connected to a second inverter to receive said sense amplifier enable signal, and an output of said NAND gate being connected for enabling said sense amplifier.

6. The semiconductor static random access memory device of claim 5, wherein said time delay circuit for said world line enable signal comprises a cascade of two consecutive inverters.

7. The semiconductor static random access memory device of claim 5, wherein said time delay circuit for said word line enable signal comprises a cascade of two consecutive inverters each having an output thereof connected to a power and ground bus respectively via a pair of capacitors.

8. In a semiconductor static random access memory device including a memory cell array, a row decoder, a column decoder, an address buffer, an access control pulse generator, a sense amplifier and an address transition detector, said address buffer receiving an externally issued memory access address for relay to said row decoder in order to decode the row address, and for relay to said address transition detector in order to detect the transition status of the address bits of said access address received so as to cause said access control pulse generator to generate a sense amplifier enable signal and a word line enable signal, a noise eliminator comprising a converter for receiving said sense amplifier enable signal and said word line enable signal and for conducting a logical OR conversion of said signals which is issued to said sense amplifier for enabling said sense amplifier to implement the data access to said static random access memory device.

* * * * *